US012178148B2

United States Patent
Fukuda et al.

(10) Patent No.: US 12,178,148 B2
(45) Date of Patent: Dec. 24, 2024

(54) STORAGE DEVICE

(71) Applicant: KIOXIA CORPORATION, Tokyo (JP)

(72) Inventors: Kenji Fukuda, Yokohama Kanagawa (JP); Rina Nomoto, Bunkyo Tokyo (JP); Hiroyuki Kanaya, Yokkaichi Mie (JP); Masahiko Nakayama, Kuwana Mie (JP); Hideyuki Sugiyama, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 175 days.

(21) Appl. No.: 17/899,914

(22) Filed: Aug. 31, 2022

(65) Prior Publication Data
US 2023/0309428 A1 Sep. 28, 2023

(30) Foreign Application Priority Data

Mar. 23, 2022 (JP) ................................ 2022-046174

(51) Int. Cl.
*H10N 70/00* (2023.01)
*G11C 11/16* (2006.01)
(Continued)

(52) U.S. Cl.
CPC ....... *H10N 70/8833* (2023.02); *G11C 11/161* (2013.01); *H10B 61/00* (2023.02);
(Continued)

(58) Field of Classification Search
CPC ............. H10N 70/8833; H10N 70/023; H10N 70/063; H10N 70/8613; H10N 50/10;
(Continued)

(56) References Cited

U.S. PATENT DOCUMENTS 9,368,721 B1 6/2016 Bodke et al.
9,425,237 B2 8/2016 Jo
(Continued)

FOREIGN PATENT DOCUMENTS

CN 107204351 A 9/2017
JP 2013-062327 A 4/2013
(Continued)

OTHER PUBLICATIONS

J. M. Lopez et al., "Ge—Se—Sb—N-based OTS scaling perspectives for high-density 1S1R crossbar arrays" 2021 IEEE International Memory Workshop (IMW), IEEE, 2021, 4 pages.
(Continued)

*Primary Examiner* — Son L Mai
(74) *Attorney, Agent, or Firm* — Kim & Stewart LLP

(57) ABSTRACT

A storage device includes a memory cell including a variable resistance element and a switching element having snapback current-voltage characteristics. The switching element includes a first conductive layer in contact with the variable resistance element, a second conductive layer, and a switching layer provided between the first conductive layer and the second conductive layer. The switching layer includes at least one switching member and a first insulating layer having a thermal conductivity higher than 1.4 W/m/K. A cross-sectional area of the switching member at a connection surface between the switching layer and the first conductive layer and a cross-sectional area of the switching member at a connection surface between the switching layer and the second conductive layer are each smaller than a cross-sectional area at a connection surface between the first conductive layer and the variable resistance element.

15 Claims, 15 Drawing Sheets

(51) Int. Cl.
  *H10B 61/00* (2023.01)
  *H10B 63/00* (2023.01)
  *H10N 50/10* (2023.01)
  *H10N 50/80* (2023.01)
  *H10N 50/85* (2023.01)
(52) U.S. Cl.
  CPC ............. *H10B 63/80* (2023.02); *H10N 50/10* (2023.02); *H10N 50/80* (2023.02); *H10N 50/85* (2023.02); *H10N 70/023* (2023.02); *H10N 70/063* (2023.02); *H10N 70/8613* (2023.02)
(58) Field of Classification Search
  CPC ........ H10N 50/80; H10N 50/85; H10B 61/00; H10B 63/80; G11C 11/161
  See application file for complete search history.

(56) References Cited

U.S. PATENT DOCUMENTS

| | | | |
|---|---|---|---|
| 9,633,724 | B2 | 4/2017 | Jo et al. |
| 10,177,308 | B2 | 1/2019 | Yang et al. |
| 10,418,101 | B1* | 9/2019 | Miyazaki ................ G11C 11/36 |
| 10,460,799 | B2* | 10/2019 | Kim ...................... G11C 13/004 |
| 10,770,509 | B2 | 9/2020 | Furuhashi |
| 2017/0271581 | A1 | 9/2017 | Seong et al. |
| 2020/0083285 | A1 | 3/2020 | Nagase et al. |
| 2021/0296568 | A1 | 9/2021 | Igarashi et al. |
| 2023/0069841 | A1* | 3/2023 | Asao ...................... H10N 50/10 |

FOREIGN PATENT DOCUMENTS

| | | |
|---|---|---|
| JP | 5982539 B2 | 8/2016 |
| JP | 2019-161179 A | 9/2019 |
| JP | 2020-043131 A | 3/2020 |
| JP | 6714512 B2 | 6/2020 |
| JP | 2021-150390 A | 9/2021 |

OTHER PUBLICATIONS

M.J. Lee et al., "Highly-Scalable Threshold Switching Select Device based on Chaclogenide Glasses for 3D Nanoscaled Memory Arrays" IEDM (2012), IEEE, 2012, pp. 2.6.1-2.6.3.

* cited by examiner

STORAGE DEVICE

CROSS-REFERENCE TO RELATED APPLICATION(S)

This application is based upon and claims the benefit of priority from Japanese Patent Application No. 2022-046174, filed Mar. 23, 2022, the entire contents of which are incorporated herein by reference.

FIELD

Embodiments described herein relate generally to a storage device.

BACKGROUND

A storage device in which memory cells each including a variable resistance element such as a magnetoresistance effect element and a selector element (e.g., switching element) are integrated on a semiconductor substrate is known.

DETAILED DESCRIPTION

Figure 1:
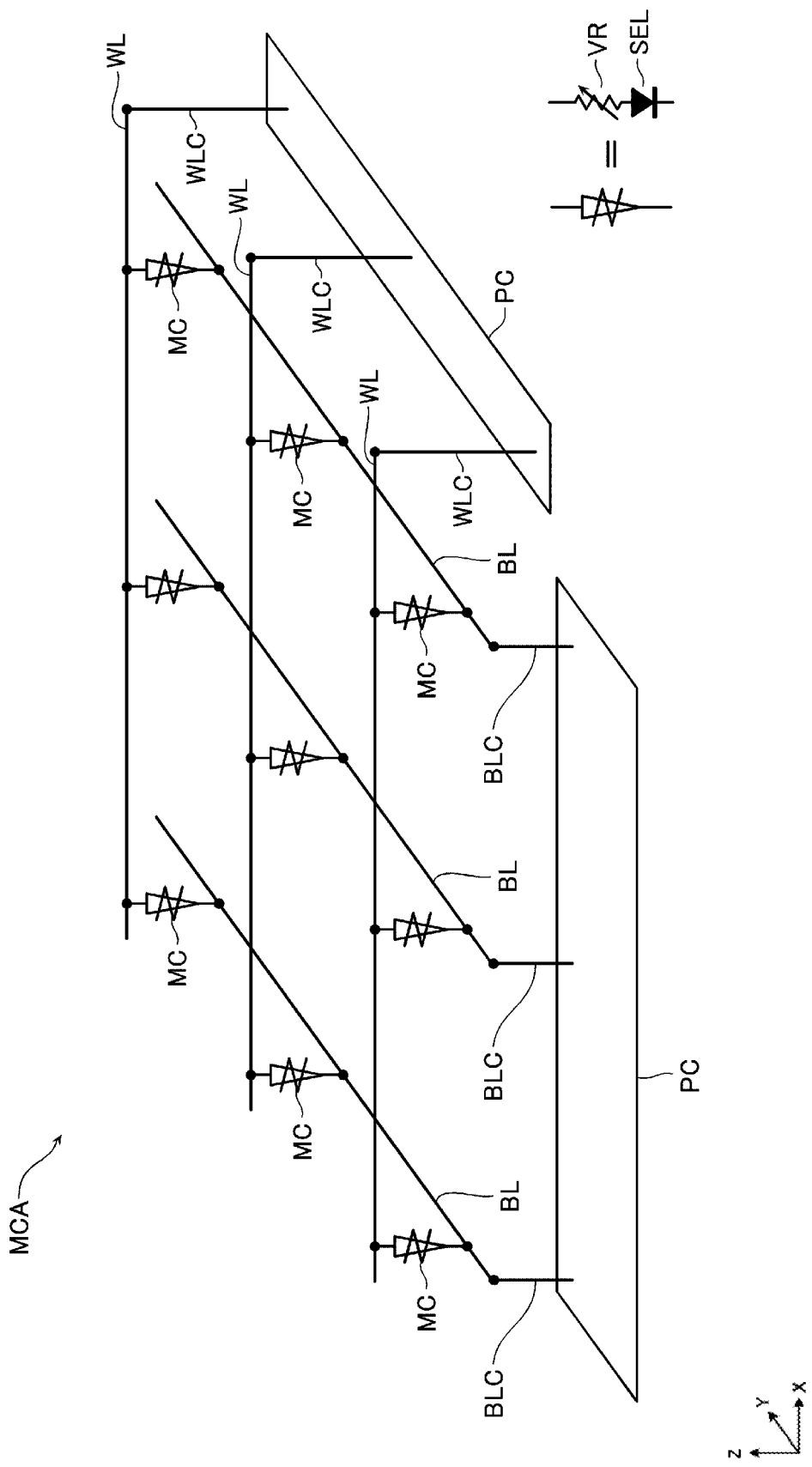
FIG. 1 is a schematic circuit diagram illustrating configurations of part of a storage device according to a first embodiment.

Embodiments provide a storage device capable of maintaining characteristics of a memory cell and reducing a leak current.

In general, according to one embodiment, a storage device includes a memory cell including a variable resistance element and a switching element having snapback current-voltage characteristics. The switching element includes a first conductive layer in contact with the variable resistance element, a second conductive layer, and a switching layer provided between the first conductive layer and the second conductive layer. The switching layer includes one or more switching members and a first insulating layer having a thermal conductivity higher than 1.4 W/m/K. A cross-sectional area or a sum of cross-sectional areas of the one or more switching members at a connection surface between the switching layer and the first conductive layer and a cross-sectional area or a sum of cross-sectional areas of the one or more switching members at a connection surface between the switching layer and the second conductive layer are each smaller than a cross-sectional area at a connection surface between either the first conductive layer and the variable resistance element.

Storage devices according to embodiments will be described hereinafter in detail with reference to the drawings. It is noted that the embodiments below are only examples and not intended to limit the disclosure.

Furthermore, in the present specification, a predetermined direction parallel to a surface of a substrate will be referred to as "X direction", a direction parallel to the surface of the substrate and perpendicular to the X direction will be referred to as "Y direction", and a direction perpendicular to the surface of the substrate will be referred to as "Z direction".

Moreover, in the present specification, a direction along a predetermined surface will be often referred to as "first direction", a direction along this predetermined surface and crossing the first direction will be often referred to as "second direction", and a direction crossing this predetermined surface will be often referred to as "third direction". Each of the first direction, the second direction, and the third direction may or may not correspond to any of the X direction, the Y direction, and the Z direction.

Furthermore, in the present specification, expressions like "upper" and "lower" are based on the substrate. For example, when the first direction crosses the surface of the substrate, a direction that is away from the substrate along this first direction is referred to as an "upper" direction and a direction that is toward the substrate along the first direction is referred to as a "lower" direction. Moreover, it is assumed that a lower surface or a lower end for a certain configuration refers to a surface or an end portion of the configuration closer to the substrate, and that an upper surface or an upper end for the certain configuration refers to a surface or an end portion of the configuration farther from the substrate. Furthermore, a surface crossing either a second direction or a third direction (the second and third directions crossing each other and the first direction, and parallel to the surface of the substrate) will be referred to as "side surface" or the like.

Storage devices according to embodiments will be described hereinafter in detail with reference to the drawings. It is noted that the drawings described below are schematic and some configurations are often omitted for the sake of description. Furthermore, common elements to a plurality of embodiments are denoted by common reference signs and often not described repeatedly.

First Embodiment

[Configurations]

Figure 2:
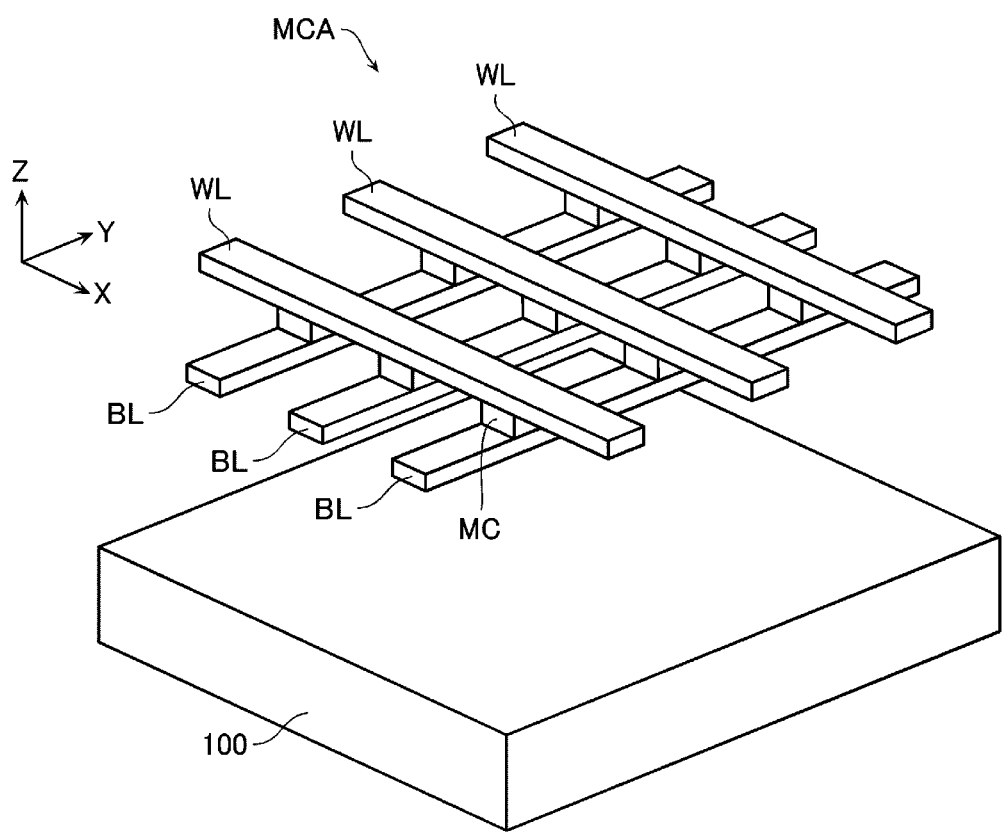
FIG. 2 is a schematic perspective view illustrating configurations of part of the storage device.

FIG. 1 is a schematic circuit diagram illustrating configurations of part of a storage device according to a first embodiment. FIG. 2 is a schematic perspective view illustrating configurations of part of the storage device.

The storage device according to the present embodiment includes a memory cell array MCA and a peripheral circuit PC controlling the memory cell array MCA.

As illustrated in, for example, FIG. 2, the memory cell array MCA is provided above a substrate 100. The memory cell array MCA includes a plurality of bit lines (more generally referred to as "interconnections") BL, a plurality of word lines (more generally referred to as "interconnections") WL, and a plurality of memory cells MC. The plurality of bit lines BL are apart from the plurality of word lines WL in the Z direction. The plurality of bit lines BL are arranged in the X direction and extend in the Y direction. The plurality of word lines WL are arranged in the Y direction and extend in the X direction. The plurality of memory cells MC are arranged in the X direction and the Y direction to correspond to the plurality of bit lines BL and the plurality of word lines WL. In an example of FIG. 1, one end of each memory cell MC is connected to one bit line BL. In addition, the other end of the memory cell MC is connected to one word line WL. Each memory cell MC includes a variable resistance element VR and a selector element (e.g., switching element) SEL. The variable resistance element VR and the selector element SEL are connected in series between one bit line BL and one word line WL. For example, one end of the variable resistance element VR is connected to the word line WL. The other end of the variable resistance element VR is connected to one end of the selector element SEL. The other end of the selector element SEL is connected to the bit line BL. The variable resistance element VR and the selector element SEL may be connected in a reverse manner between the bit line BL and the word line WL.

The configurations described with reference to FIGS. 1 and 2 are only an example. For example, one end of the memory cell MC may be connected to the word line WL. In addition, the other end of the memory cell MC may be connected to the bit line BL. Furthermore, the variable resistance element VR and the selector element SEL may be connected in a reverse manner between the bit line BL and the word line WL. Furthermore, the bit lines BL may be provided either below or above the word lines WL.

The peripheral circuit PC is provided, for example, on an upper surface of the substrate 100 illustrated in FIG. 2. The peripheral circuit PC includes a plurality of field effect transistors, not illustrated, which are formed on the upper surface of the substrate 100 and a plurality of interconnections, not illustrated, which are connected to these field effect transistors. In the example of FIG. 1, the peripheral circuit PC is connected to each bit line BL via a bit line contact BLC. In addition, the peripheral circuit PC is connected to each word line WL via a word line contact WLC.

The peripheral circuit PC includes, for example, a data register that stores user data read from each memory cell MC and that stores user data written to the memory cell MC, an address register that stores address data about each memory cell MC subjected to either a read operation or a write operation, and a command register that stores command data. The peripheral circuit PC also includes, for example, a step-down circuit that steps down a supplied power supply voltage or the like and that outputs the stepped-down voltage to a voltage supply line, a voltage transfer circuit that makes the bit line BL and the word line WL corresponding to the address data electrically connected to the corresponding voltage supply line, and a sense amplifier circuit that outputs data 0 or 1 in response to a voltage or a current of the bit line BL and that outputs the data to the data register. Furthermore, the peripheral circuit PC includes, for example, a sequencer controlling these elements.

Figure 3:
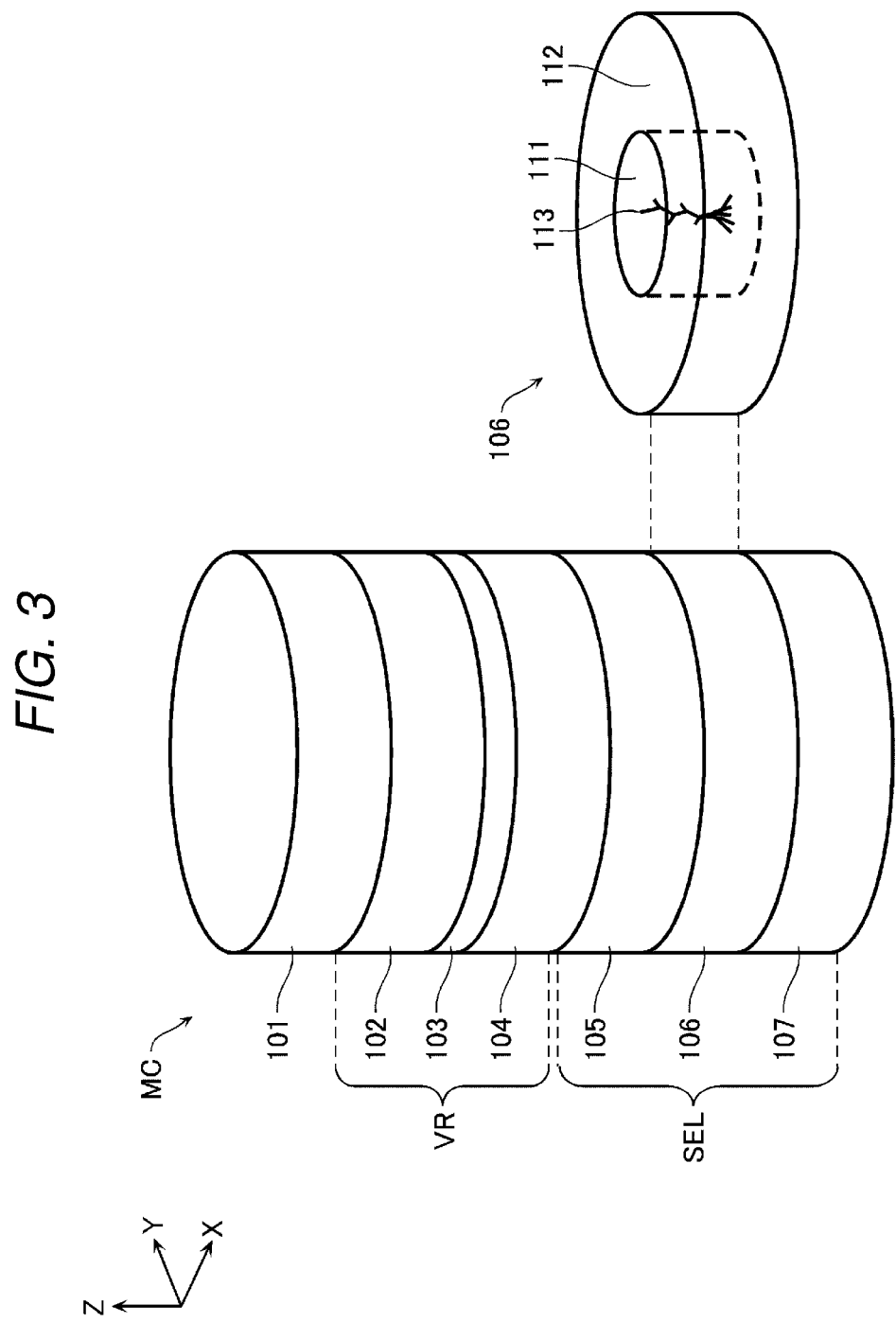
FIG. 3 is a schematic perspective view illustrating configurations of a memory cell.

FIG. 3 is a schematic perspective view illustrating configurations of one memory cell MC according to the present embodiment.

The memory cell MC illustrated in FIG. 3 includes an electrode 101 provided between one word line WL and one bit line BL described with reference to FIGS. 1 and 2, the variable resistance element VR provided between the electrode 101 and the bit line BL, and the selector element SEL provided between the variable resistance element VR and the bit line BL.

The variable resistance element VR is, for example, an MTJ (magnetic tunnel junction) element in which a TMR (tunneling magnetoresistance) effect occurs. The following descriptions and drawings are based on an example in which the variable resistance element VR is the MTJ element. The MTJ element is an element used in an MRAM (Magnetoresistive Random Access Memory). The MTJ element is also referred to as "magnetoresistance effect element". As illustrated in FIG. 3, the variable resistance element VR includes, for example, a magnetic layer 102, a tunnel barrier layer (non-magnetic layer) 103, and a magnetic layer 104. For example, one of the magnetic layers 102 and 104 is higher in coercivity than the other magnetic layer 102 or 104. Furthermore, one of the magnetic layers 102 and 104 functions as a reference layer and the other magnetic layers 102 or 104 functions as a storage layer. In a state, i.e., P (parallel) state in which a magnetization direction of the magnetic layer 102 is parallel to a magnetization direction of the magnetic layer 104, an electrical resistance value between the magnetic layers 102 and 104 is relatively small. This state will be referred to as "low resistance state", hereinafter. In a state, i.e., AP (antiparallel) state in which the magnetization direction of the magnetic layer 102 is antiparallel to the magnetization direction of the magnetic layer 104, the electrical resistance value between the magnetic layers 102 and 104 is relatively large due to the TMR effect. This state will be referred to as "high resistance state", hereinafter. The storage device according to the present embodiment can store one-bit data in one memory cell MC by allocating "0" to one of the low resistance state and the high resistance state and "1" to the other state.

Out of the magnetic layers 102 and 104, the magnetic layer that functions as the storage layer includes a ferromagnetic layer having a variable magnetization direction. The variable magnetization direction means that the magnetization direction varies with respect to a predetermined write current that passes therethrough.

Out of the magnetic layers 102 and 104, the magnetic layer that functions as the reference layer includes a ferromagnetic layer having a fixed magnetization direction. The fixed magnetization direction means that the magnetization direction does not vary with respect to the predetermined write current that passes therethrough.

The magnetic layers 102 and 104 are ferromagnetic layers containing, for example, at least one of cobalt (Co), iron (Fe), and nickel (Ni). Furthermore, the magnetic layers 102 and 104 may also contain boron (B). More specifically, the magnetic layers 102 and 104 contain, for example, cobalt iron boron (CoFeB) or iron boride (FeB).

The tunnel barrier layer 103 may contain magnesium (Mg) and oxygen (O).

As illustrated in FIG. 3, the selector element SEL includes, for example, an electrode 105, a selector layer (functioning as a switching layer) 106, and an electrode 107. The electrode 105 electrically connects the variable resistance element VR to the selector layer 106. The electrode 105 is a conductive layer and formed of a conductive material. Specifically, the electrode 105 is formed of a metallic material.

The selector layer 106 includes a selector member (also referred to as a "switching member") 111 and an insulating layer 112.

In an example illustrated in FIG. 3, the selector member 111 has a columnar shape. When the selector element SEL is in an on state, a filament 113 is temporarily formed in the selector member 111. The filament 113 makes the electrodes 105 and 107 electrically connected to each other. The filament 113 contains, for example, an oxygen defect. When the selector element SEL is in an off state, at least part of the filament 113 breaks, so that the electrodes 105 and 107 are electrically disconnected from each other. The selector element SEL in this way will be often referred to as "filament-type selector element", hereinafter.

The selector member 111 may contain, for example, a metal oxide. The selector member 111 may contain, for example, $MO_{2-x}$, where M is cerium (Ce), zinc (Zr), or the like, or contain $A_xM_2O_4$, where A is lithium (Li), sodium (Na), potassium (K), lanthanum (La), or the like, and M is nickel (Ni), cobalt (Co), manganese (Mn), or the like. Furthermore, the selector member 111 may contain a metal oxide other than those mentioned above or may contain a material other than the metal oxide.

It is assumed, for example, that a contact area or a facing area between the selector member 111 and the electrode 105 is an area $S_{111U}$. It is also assumed, for example, that a contact area or a facing area between the selector member 111 and the electrode 107 is an area $S_{111L}$. It is further assumed, for example, that a contact area or a facing area between the magnetic layer 102 and the electrode 101 is an area $S_{102U}$. Furthermore, it is assumed, for example, that a contact area or a facing area between the magnetic layer 104 and the electrode 105 is an area $S_{104L}$. In this case, the areas $S_{111U}$ and $S_{111L}$ are smaller than the areas $S_{102U}$ and $S_{104L}$.

Moreover, it is assumed, for example, that a contact area or a facing area between the selector layer 106 and the electrode 105 is an area $S_{106U}$. It is also assumed, for example, that a contact area or a facing area between the selector layer 106 and the electrode 107 is an area $S_{106L}$. In this case, the areas $S_{106U}$ and $S_{106L}$ may be equal to the areas $S_{102U}$ and $S_{104L}$. At least the areas $S_{111U}$ and $S_{111L}$ are smaller than the areas $S_{106U}$ and $S_{106L}$.

The insulating layer 112 contacts an outer periphery of the selector member 111. The insulating layer 112 contains, for example, a material higher in thermal conductivity than silicon oxide ($SiO_2$) and similar in electrical resistivity to silicon oxide ($SiO_2$). It is noted that a thermal conductivity of silicon oxide ($SiO_2$) is approximately 1.4 W/m/k. In addition, an electrical resistivity of silicon oxide ($SiO_2$) is approximately, $1 \times 10^{16}$ Ω·cm.

Examples of the material of the insulating layer 112 include beryllium oxide (BeO) (thermal conductivity: approximately 250 W/m/K, electrical resistivity: approximately $1 \times 10^{16}$ Ω·cm, crystal structure: wurtzite type), aluminum nitride (AlN) (thermal conductivity: approximately 285 W/m/K, electrical resistivity: approximately $1 \times 10^{14}$ Ω·cm, crystal structure: wurtzite type), magnesium oxide (MgO) (thermal conductivity: approximately 59 W/m/K, electrical resistivity: approximately $1 \times 10^{14}$ Ω·cm, crystal structure: rock salt type), silicon nitride ($Si_3N_4$) (thermal conductivity: approximately 25 to 54 W/m/K, electrical resistivity: approximately $1 \times 10^{14}$ Ω·cm, crystal structure: hexagonal), and diamond-like carbon (thermal conductivity: approximately 200 W/m/K, electrical resistivity: approximately $1 \times 10^2$ to $1 \times 10^{12}$ Ω·cm, crystalline structure: amorphous).

The electrode 107 is a conductive layer and formed of a conductive material. Specifically, the electrode 107 is formed of a metallic material.

An upper surface of the electrode 101 contacts a lower surface of the word line WL. An upper surface of the magnetic layer 102 contacts a lower surface of the electrode 101. An upper surface of the tunnel barrier layer 103 contacts a lower surface of the magnetic layer 102. An upper surface of the magnetic layer 104 contacts a lower surface of the tunnel barrier layer 103. An upper surface of the electrode 105 contacts a lower surface of the magnetic layer 104. An upper surface of the selector layer 106 contacts a lower surface of the electrode 105. An upper surface of the electrode 107 contacts a lower surface of the selector layer 106. A lower surface of the electrode 107 contacts an upper surface of the bit line BL.

[Electrical Characteristics of Selector Element SEL]

Figure 4:
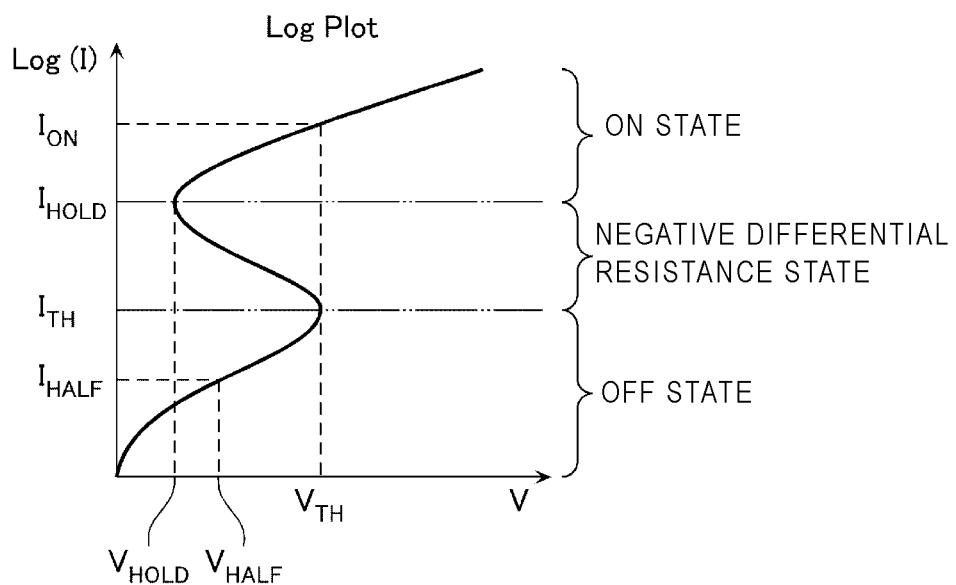
FIGS. 4-5 are schematic graphs illustrating current-voltage characteristics in a case of current flowing through a selector element.
Figure 5:
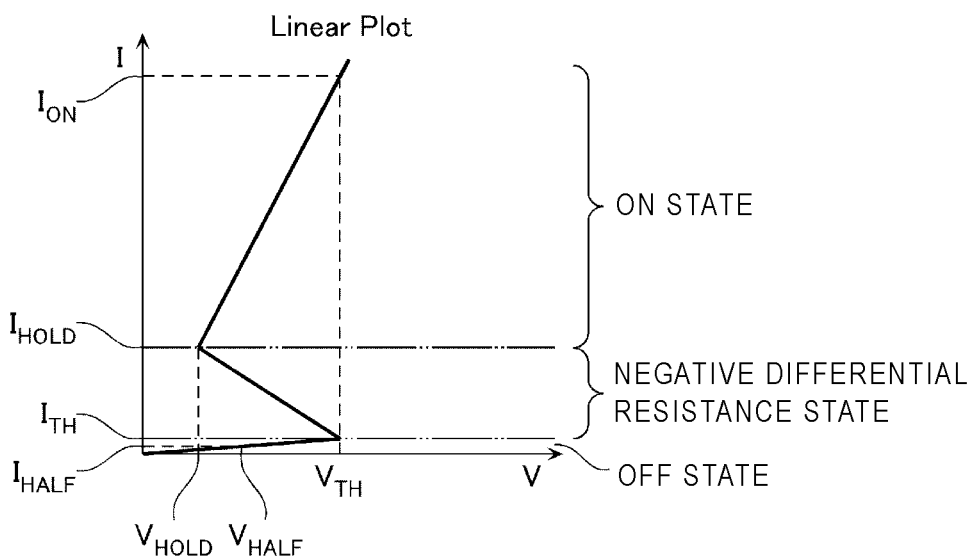

FIGS. 4 and 5 are schematic graphs illustrating current-voltage characteristics in a case of current sweeping to the selector element SEL. In FIGS. 4 and 5, a vertical axis indicates a current I flowing in the selector element SEL. In FIG. 4, the current I supplied to the selector element SEL is indicated in log scale. In addition, a horizontal axis indicates a voltage V between the electrodes of the selector element SEL.

The selector element SEL according to the present embodiment has snapback current-voltage characteristics. The snapback current-voltage characteristics will be described below.

In an example of FIGS. 4 and 5, a range in which the current I is equal to or higher than zero and lower than a current $I_{TH}$ is indicated as an off state. In addition, a range in which the current I is equal to or higher than the current $I_{TH}$ and lower than a current $I_{HOLD}$ is indicated as a negative differential resistance state. Furthermore, a range in which the current I is equal to or higher than the current $I_{HOLD}$ is indicated as an on state.

When the voltage V between the electrodes of the selector element SEL is increased from 0 V to a threshold voltage $V_{TH}$, the selector element SEL is in the off state until the voltage V reaches the threshold voltage $V_{TH}$. When the voltage V reaches the threshold voltage $V_{TH}$, the selector element SEL is switched from the off state to the on state.

In FIGS. 4 and 5, the current I when the selector element SEL is in the off state and the voltage V is equal to the threshold voltage $V_{TH}$ is indicated as a current $I_{TH}$. Furthermore, a voltage that is half of the threshold voltage $V_{TH}$ is indicated as a voltage $V_{HALF}$. Moreover, the current I when the selector element SEL is in the off state and the voltage V is equal to the voltage $V_{HALF}$ is indicated as a current $I_{HALF}$.

When the selector element SEL is in the on state and the voltage V is reduced from the threshold voltage $V_{TH}$ to a hold voltage $V_{HOLD}$, the selector element SEL is in the on state until the voltage V reaches the hold voltage $V_{HOLD}$. When the voltage V reaches the hold voltage $V_{HOLD}$, the selector element SEL is switched from the on state to the off state.

In FIGS. 4 and 5, the current I when the selector element SEL is in the on state and the voltage V is equal to the threshold voltage $V_{TH}$ is indicated as a current $I_{ON}$. Moreover, the current I when the selector element SEL is in the on state and the voltage V is equal to the voltage $V_{HOLD}$ is indicated as the current $I_{HOLD}$. In the example of FIGS. 4 and 5, the hold voltage $V_{HOLD}$ is lower than the voltage $V_{HALF}$.

[Read Operation]

Figure 6:
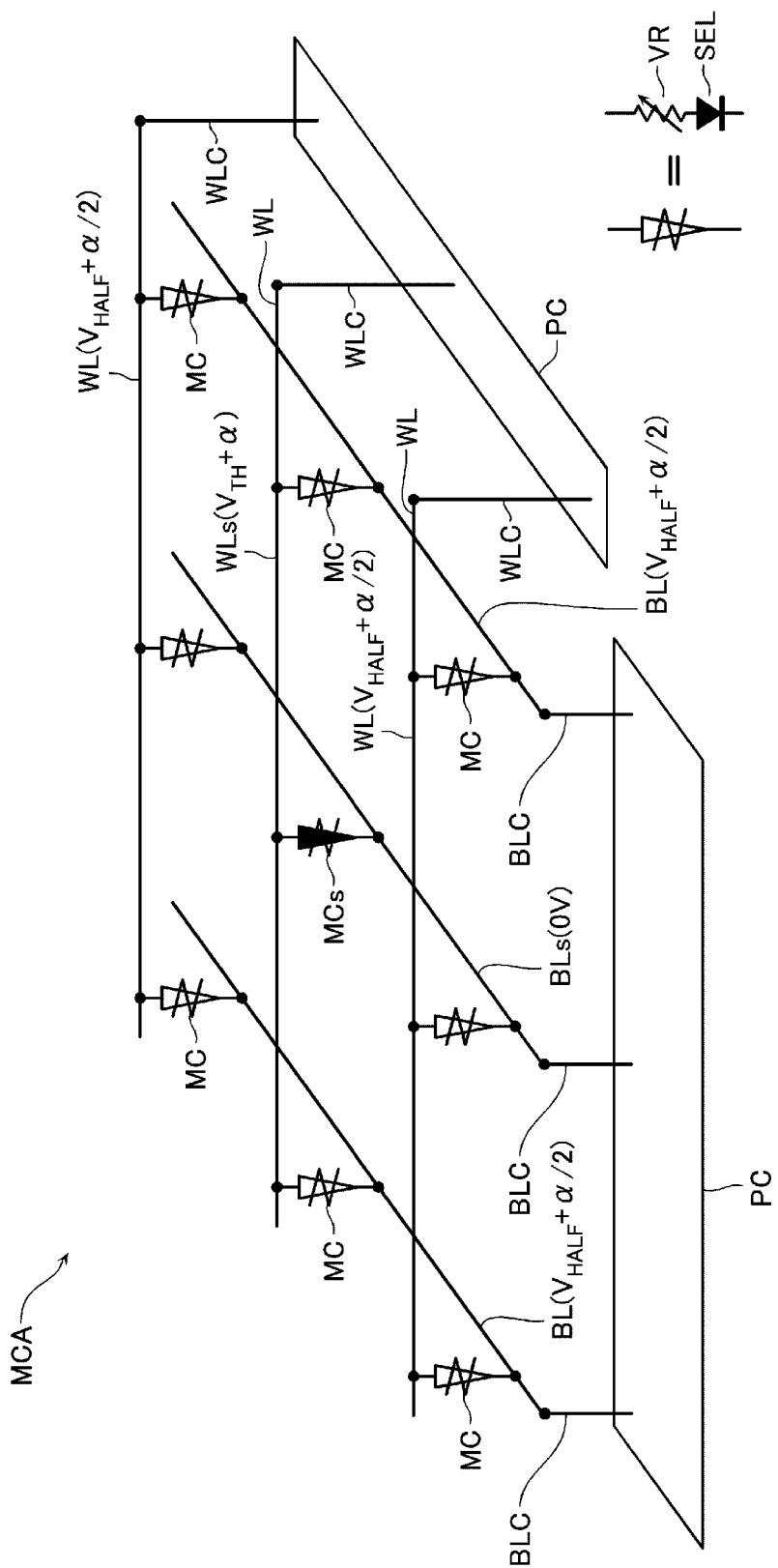
FIG. 6 is a schematic circuit diagram illustrating an example of a read operation by the storage device according to the first embodiment.

FIG. 6 is a schematic circuit diagram illustrating an example of a read operation by the storage device according to the present embodiment. In the example of FIG. 6, the word line WL subjected to the read operation is indicated as a selected word line $WL_S$. In addition, the bit line BL subjected to the read operation is indicated as a selected bit line $BL_S$. Furthermore, the memory cell MC subjected to the read operation is indicated as a selected memory cell $MC_S$.

In the read operation, a sum of the threshold voltage $V_{TH}$ and a voltage α, for example, is supplied to the selected word line WL as illustrated in FIG. 6. The voltage α corresponds to a voltage drop of the MTJ or the like. Furthermore, 0 V is supplied to the selected bit line $BL_S$. Moreover, a sum of the voltage $V_{HALF}$ and a voltage α/2 is supplied to the other word lines WL and the other bit lines BL.

As a result, the sum of the threshold voltage $V_{TH}$ and the voltage α is supplied to the selected memory cell $MC_S$. Furthermore, a voltage that is approximately the threshold voltage $V_{TH}$ is supplied to the selector element SEL of the selected memory cell $MC_S$ and this selector element SEL goes into the on state.

As for the other memory cells MC, the sum of the voltage $V_{HALF}$ and the voltage α/2 is supplied to those connected to only one of the selected word line $WL_S$ and the selected bit line $BL_S$. These memory cells MC are referred to as "half-selected memory cells MC". Furthermore, a voltage that is approximately the voltage $V_{HALF}$ is supplied to the selector elements SEL of these memory cells MC and the selector elements SEL are kept in the off state.

0 V is supplied to the other memory cells MC. These memory cells MC are referred to as "non-selected memory cells MC". The selector elements SEL of these memory cells MC are kept in the off state.

Moreover, in the read operation illustrated in FIG. 6, when the current flowing in the selected bit line $BL_S$ is higher than, for example, a predetermined threshold, it is determined that a state of the selected memory cell $MC_S$ is the low resistance state. In addition, when the current flowing in the selected bit line $BL_S$ is lower than the predetermined threshold, it is determined that the state of the selected memory cell $MC_S$ is the high resistance state.

[Preferred Characteristics of Selector Element SEL]

The threshold voltage $V_{TH}$ described with reference to FIGS. 4 and 5 is preferably low for low power consumption of the storage device. Furthermore, when the threshold voltage $V_{TH}$ is low, transistors used in the peripheral circuit PC can be reduced in size. To reduce the area of the peripheral circuit PC, therefore, it is preferable that the threshold voltage $V_{TH}$ is low.

Moreover, when the read operation described with reference to FIG. 6 is executed, a state of the variable resistance element VR is determined by the current flowing in the selected bit line $BL_S$. Here, when the read operation described with reference to FIG. 6 is executed, the sum of the voltage $V_{HALF}$ and the voltage α/2 is supplied to the half-selected memory cells MC connected to the selected bit line $BL_S$. As a result, a leak current that is approximately the current $I_{HALF}$ described with reference to FIGS. 4 and 5 often flows in these half-selected memory cells MC. For example, when the number of the memory cells MC connected to the selected bit line $BL_S$ is equal to or greater than a certain number, a noise current in the selected bit line $BL_S$ becomes too high. This may make it impossible to distinguish the current flowing in the selected memory cell $MC_S$ from the leak current flowing in the half-selected memory cells MC. It is, therefore, preferable that the current $I_{ON}$ described with reference to FIGS. 4 and 5 is high and that the current $I_{HALF}$ described with reference to FIGS. 4 and 5 is low.

In general, however, a relationship between the threshold voltage $V_{TH}$ and the current $I_{HALF}$ is a trade-off. That is, when the threshold voltage $V_{TH}$ is lower, the current $I_{HALF}$ is higher. In addition, when the current $I_{HALF}$ is lower, the threshold voltage $V_{TH}$ is higher.

[Reduction of Current $I_{HALF}$]

As described with reference to FIG. 3, the selector member 111 according to the present embodiment is a filament-type selector element. When the selector element SEL is in the on state, the electrodes 105 and 107 are continuous via the filament 113. On the other hand, when the selector element SEL is in the off state, at least part of the filament 113 is lost.

With these configurations, a current flowing in the selector element SEL while the selector element SEL is in the on state (hereinafter, "ON current") mainly flows in the filament 113. Therefore, the ON current of the selector element SEL does not rely on a cross-sectional area of an XY cross-section of the selector member 111. On the other hand, a current flowing in the selector element SEL while the selector element SEL is in the off state (hereinafter, "OFF current") flows in the entire selector member 111. Therefore, the OFF current of the selector element SEL relies on the cross-sectional area of the XY cross-section of the selector member 111.

Therefore, reducing the cross-sectional area of the XY cross-section of the selector member 111 enables the OFF current to be reduced without reducing the ON current, as illustrated in FIG. 3. Furthermore, such a method enables the current $I_{HALF}$ to be reduced without increasing the threshold voltage $V_{TH}$.

[Joule Heat of Selector Member 111]

In a structure illustrated in FIG. 3, the outer periphery of the selector member 111 is covered with the insulating layer 112. Here, when the insulating layer 112 is formed of the material of a low thermal conductivity, e.g., silicon oxide ($SiO_2$), Joule heat generated in the selector member 111 is difficult to dissipate and a temperature of the selector member 111 often tends to rise.

Here, when the temperature of the selector member 111 tends to rise, the hold voltage $V_{HOLD}$ described with reference to FIGS. 4 and 5 is often reduced. When a difference between the threshold voltage $V_{TH}$ and the hold voltage $V_{HOLD}$ increases, a transient current flowing in the memory cell MC when the selector element SEL is switched from the off state to the on state (hereinafter, "spike current") often becomes high. When a high spike current flows in the memory cell MC, a state of the MTJ element (variable resistance element VR) changes, which often causes data to be rewritten or degradation in film quality in the memory cell MC.

Furthermore, when the temperature of the selector member 111 tends to rise, the heat often causes degradation in film quality in the MTJ element (variable resistance element VR). Such a case may result in degradation in data retention characteristics in the MTJ element (variable resistance element VR), dielectric breakdown of the tunnel barrier layer 103, or the like.

The insulating layer 112 according to the present embodiment, therefore, contains material of relatively high thermal conductivity as described above. With such configurations, it is possible to provide the storage device capable of reducing occurrence of various phenomena accompanying the increase of the temperature of the selector member 111 and ensuring longer lifetime.

The storage device according to the present embodiment described above is capable of maintaining characteristics of the memory cell and reducing the leak current.

[Manufacturing Process of Selector Layer 106]

FIGS. 7 to 12 are schematic cross-sectional views illustrating a manufacturing process of the selector layer 106.

Figure 7:
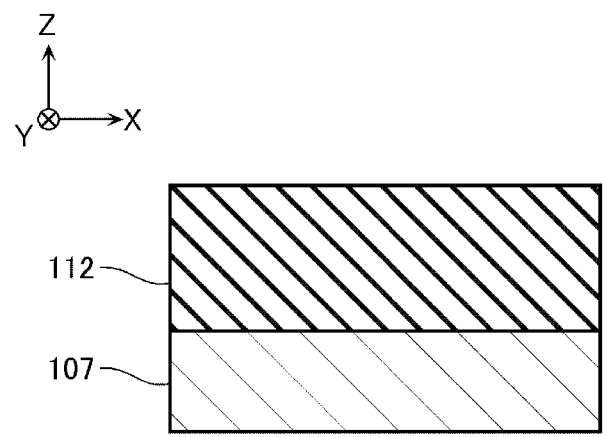
FIGS. 7-12 are schematic cross-sectional views illustrating a manufacturing process of a selector layer of the storage device according to the first embodiment.

When manufacturing the selector layer 106, the insulating layer 112 is formed on the upper surface of the electrode 107 as illustrated in FIG. 7. This process is performed by a method, e.g., PVD (Physical Vapor Deposition) such as sputtering or CVD (Chemical Vapor Deposition).

Figure 8:
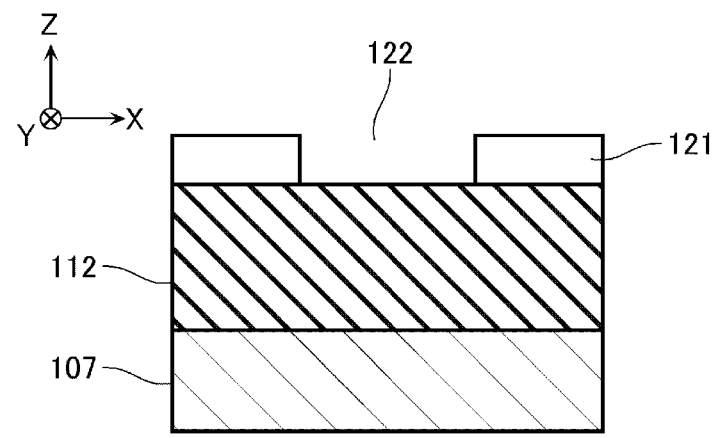

Next, as illustrated in FIG. 8, a mask 121 is formed on an upper surface of the insulating layer 112. In addition, an opening 122 is formed in the mask 121 by a method such as photolithography or etching. The opening 122 is provided at a position of the selector member 111 in a view from the Z direction. The opening 122 exposes the upper surface of the insulating layer 112.

Figure 9:
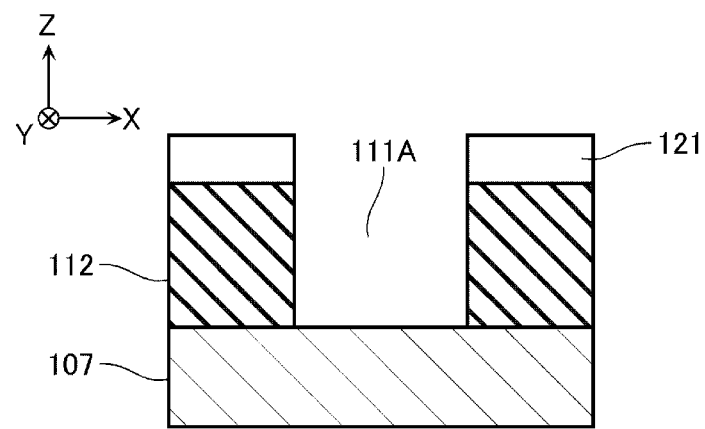

Next, as illustrated in FIG. 9, part of the insulating layer 112 is removed to form an opening 111A. The opening 111A is provided at a position of the selector member 111. The opening 111A exposes the upper surface of the electrode 107. This process is performed by, for example, anisotropic etching such as RIE (Reactive Ion Etching).

Figure 10:
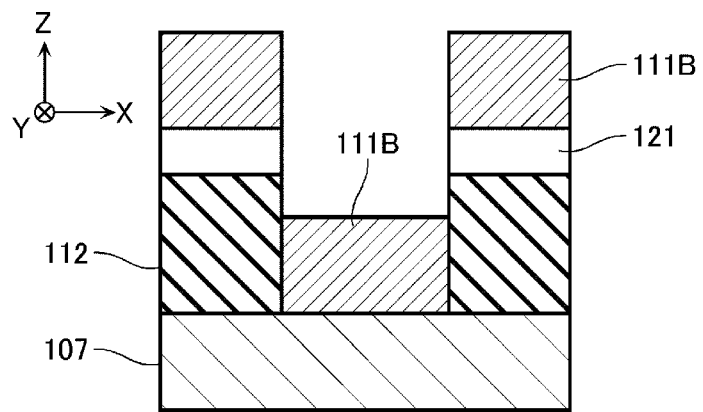

Next, as illustrated in FIG. 10, a selector member 111B is formed in the opening 111A and on an upper surface of the mask 121. This process is performed by a method, e.g., PVD such as sputtering or CVD.

Figure 11:
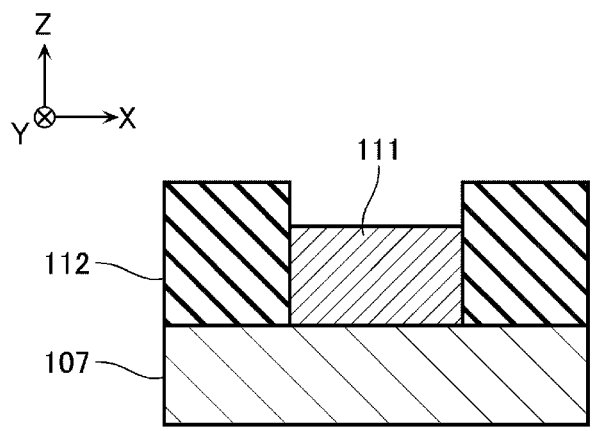

Next, as illustrated in FIG. 11, the mask 121 is removed. In this process, the selector member 111B formed on the upper surface of the mask 121 is also removed. The selector member 111B remaining in the opening 111A in this process becomes the selector member 111.

Figure 12:
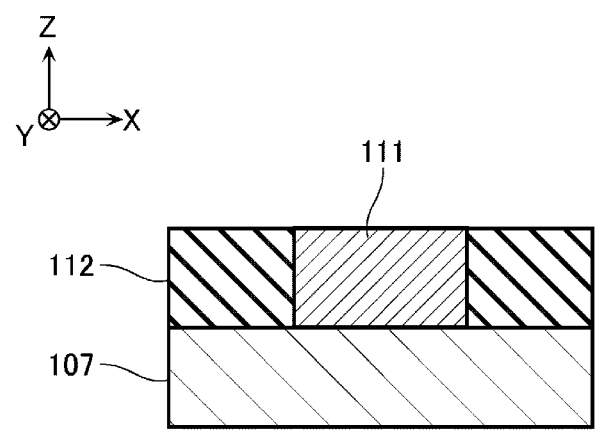

Next, as illustrated in FIG. 12, part of the insulating layer 112 is removed to make uniform height positions of the upper surfaces of the insulating layer 112 and the selector member 111. This process is performed by, for example, planarization processing such as CMP (Chemical Mechanical polishing) or etching processing such as the RIE.

After this process, the electrode 105, the magnetic layer 104, the tunnel barrier layer 103, the magnetic layer 102, and the electrode 101 described with reference to FIG. 3 are formed. This process is performed by a method, e.g., PVD such as sputtering or CVD.

Second Embodiment

Figure 13:
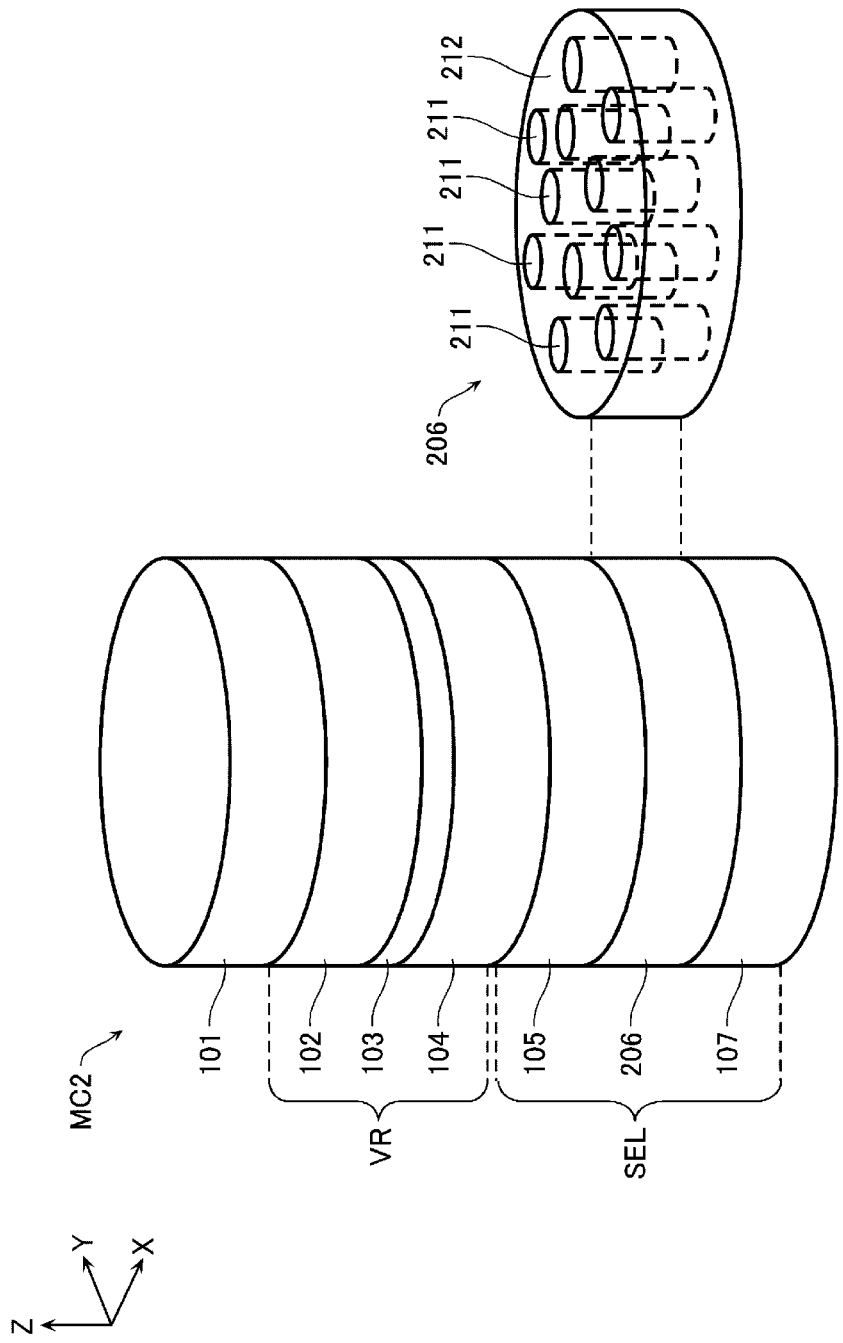
FIG. 13 is a schematic perspective view illustrating configurations of part of a storage device according to a second embodiment.

FIG. 13 is a schematic perspective view illustrating configurations of part of a storage device according to a second embodiment.

A storage device according to the second embodiment is configured basically similarly to the storage device according to the first embodiment. However, the storage device according to the second embodiment includes memory cells MC2 as an alternative to the memory cells MC. Each memory cell MC2 is configured basically similarly to the memory cell MC. However, the memory cell MC2 includes a selector layer 206 as an alternative to the selector layer 106.

In the memory cell MC2, an upper surface of the selector layer 206 contacts the lower surface of the electrode 105. The upper surface of the electrode 107 contacts a lower surface of the selector layer 206.

The selector layer 206 includes a plurality of selector members 211 and an insulating layer 212.

The selector element SEL according to the second embodiment is also a filament-type selector element. For example, when the selector element SEL is in the on state, the filament 113 described with reference to FIG. 3 is temporarily formed in at least one of the plurality of selector members 211.

It is assumed, for example, that a sum of contact areas or facing areas between the plurality of selector members 211 and the electrode 105 is an area $S_{211U}$. It is also assumed, for example, that a sum of contact areas or facing areas between the plurality of selector members 211 and the electrode 107 is an area $S_{211L}$. In this case, the areas $S_{211U}$ and $S_{211L}$ smaller than the areas $S_{102U}$ and $S_{104L}$.

Moreover, it is assumed, for example, that a contact area or a facing area between the selector layer 206 and the electrode 105 is an area $S_{206U}$. It is also assumed, for example, that a contact area or a facing area between the selector layer 206 and the electrode 107 is an area $S_{206L}$. In this case, the area $S_{206U}$ and $S_{206L}$, may be equal to the areas $S_{102U}$ and $S_{104L}$. At least the areas $S_{211U}$ and $S_{211L}$ are smaller than the areas $S_{206U}$ and $S_{206L}$.

The insulating layer 212 contacts outer peripheries of the plurality of selector members 211 in one selector layer 206. The insulating layer 212 contains, for example, a material higher in thermal conductivity than silicon oxide ($SiO_2$) and similar in electrical resistivity to silicon oxide ($SiO_2$).

The insulating layer 212 may contain any of the materials described as the materials available for the insulating layer 112.

With configurations of the second embodiment, similarly to the configurations of the first embodiment, it is possible to provide the storage device capable of maintaining characteristics of the memory cell and reducing the leak current.

[Manufacturing Processes of Selector Layer 206]

Figure 14:
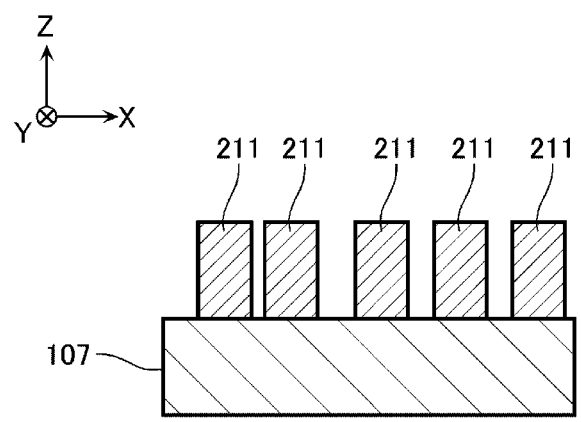
FIGS. 14-16 are schematic cross-sectional views illustrating a manufacturing process of a selector layer of the storage device according to the second embodiment.
Figure 15:
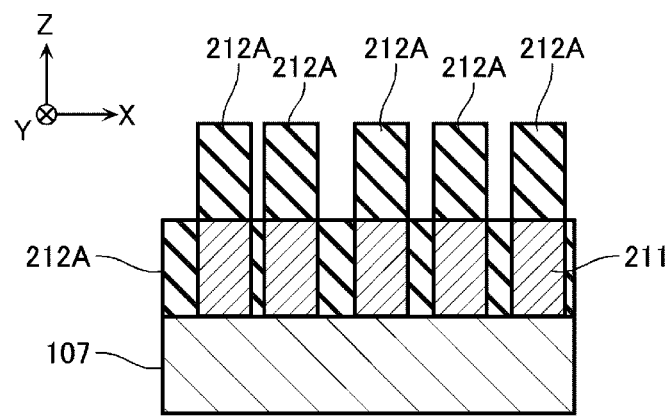
Figure 16:
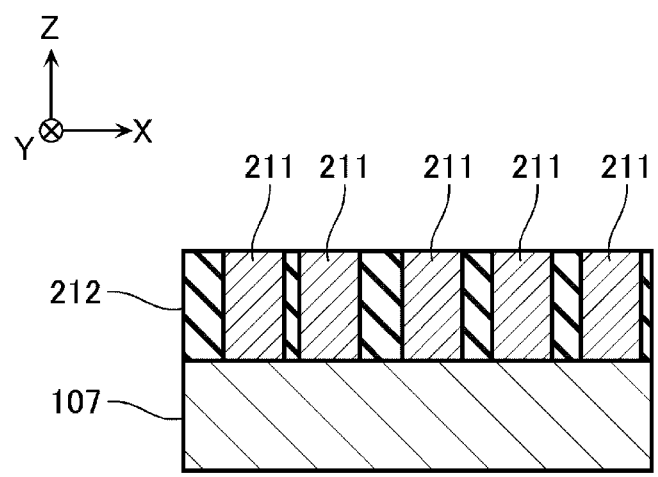

FIGS. 14 to 16 are schematic cross-sectional views illustrating a manufacturing process of the selector layer 206.

When manufacturing the selector layer 206, the plurality of selector member 211 are formed on the upper surface of the electrode 107 as illustrated in FIG. 14. This process is performed by the method, e.g., PVD such as sputtering. Furthermore, this process may be performed under conditions, e.g., that wettability between the electrode 107 and the selector members 211 is low and a surface tension of the selector members 211 is high.

Next, as illustrated in FIG. 15, an insulating layer 212A is formed on the upper surfaces of the electrode 107 and the selector members 211. This process is performed by the method, e.g., PVD such as sputtering.

Next, as illustrated in FIG. 16, part of the insulating layer 212A is removed to make uniform height positions of the upper surfaces of the insulating layer 212A and the selector members 211. This process is performed by, for example, the planarization processing such as the CMP or the etching processing such as the RIE. The insulating layer 212A remaining at the same height position as those of the selector members 211 in this process becomes the insulating layer 212.

Third Embodiment

Figure 17:
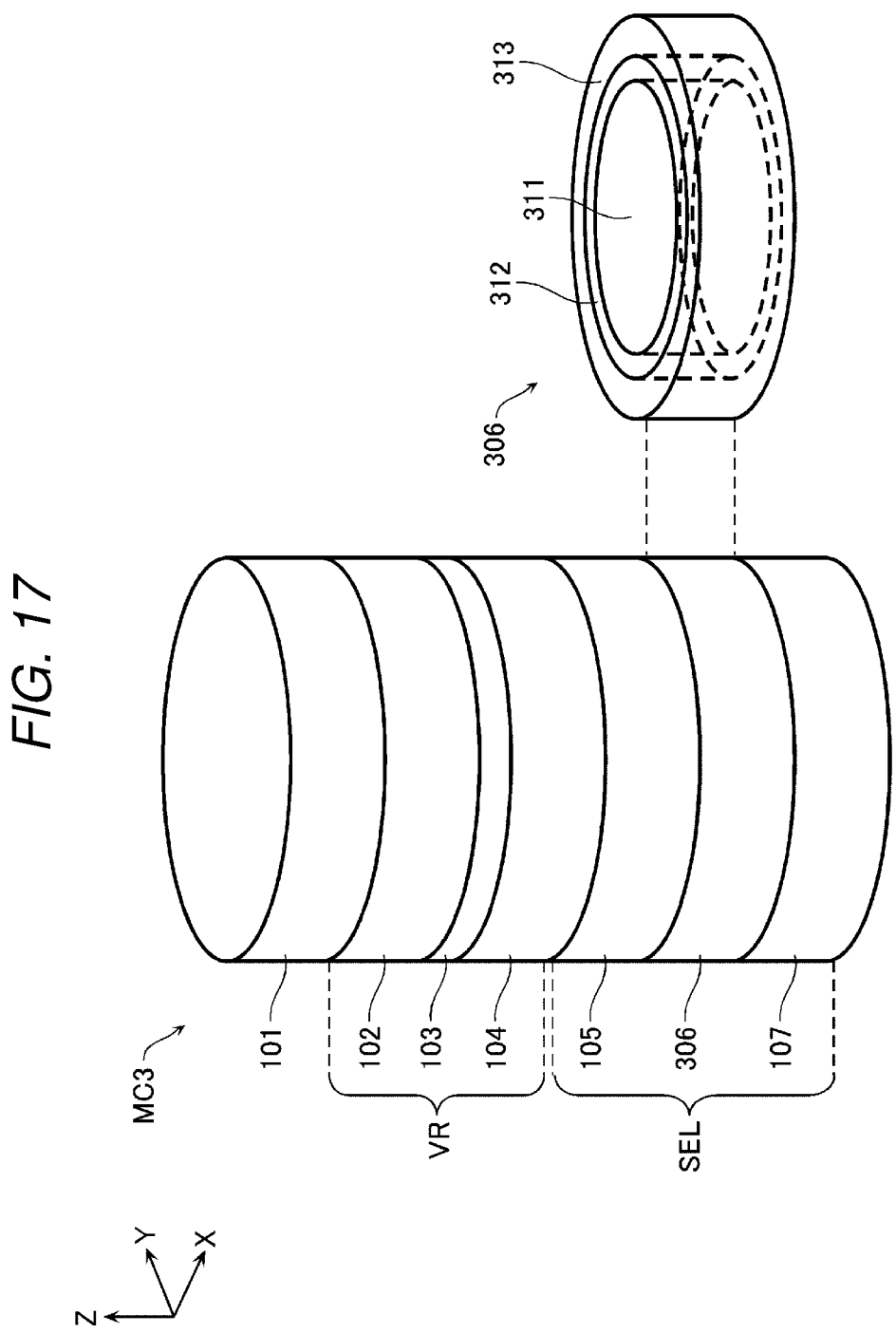
FIG. 17 is a schematic perspective view illustrating configurations of part of a storage device according to a third embodiment.

FIG. 17 is a schematic perspective view illustrating configurations of part of a storage device according to a third embodiment.

The storage device according to the third embodiment is configured basically similarly to the storage device according to the first embodiment. However, the storage device according to the third embodiment includes memory cells MC3 as an alternative to the memory cells MC. Each memory cell MC3 is configured basically similarly to the memory cell MC. However, the memory cell MC3 includes a selector layer 306 as an alternative to the selector layer 106.

In the memory cell MC3, an upper surface of the selector layer 306 contacts the lower surface of the electrode 105. The upper surface of the electrode 107 contacts a lower surface of the selector layer 306.

The selector layer 306 includes an insulating layer 311, a selector member 312, and an insulating layer 313.

In an example illustrated in FIG. 17, the insulating layer 311 is formed into a columnar shape. The insulating layer 311 contains, for example, a material higher in thermal conductivity than silicon oxide ($SiO_2$) and approximately equal in electrical resistivity to silicon oxide ($SiO_2$).

The insulating layer 311 may contain any of the materials described as the materials available for the insulating layer 112.

In the example illustrated in FIG. 17, the selector member 312 has a cylindrical shape that contacts an outer periphery of the insulating layer 311. The selector element SEL according to the third embodiment is also a filament-type selector element. For example, when the selector element SEL is in the on state, the filament 113 described with reference to FIG. 3 is temporarily formed in the selector member 312.

It is assumed, for example, that a contact area or a facing area between the selector member 312 and the electrode 105 is an area $S_{312U}$. It is also assumed, for example, that a contact area or a facing area between the selector member 312 and the electrode 107 is an area $S_{312L}$. In this case, the areas $S_{312U}$ and $S_{312L}$ are smaller than the areas $S_{102U}$ and $S_{104L}$.

Moreover, it is assumed, for example, that a contact area or a facing area between the selector layer 306 and the electrode 105 is an area $S_{306U}$. It is also assumed, for example, that a contact area or a facing area between the selector layer 306 and the electrode 107 is an area $S_{306L}$. In this case, the area $S_{306U}$ and $S_{306L}$ may be equal to the areas Sion and $S_{104L}$. At least the areas $S_{312U}$ and $S_{312L}$, are smaller than the areas $S_{306U}$ and $S_{306L}$.

The insulating layer 313 contacts an outer periphery of the selector member 312. The insulating layer 313 contains, for example, a material higher in thermal conductivity than silicon oxide ($SiO_2$) and similar in electrical resistivity to silicon oxide ($SiO_2$).

The insulating layer 313 may contain any of the materials described as the materials available for the insulating layer 112.

With configurations of the third embodiment, similarly to the configurations of the first embodiment, it is possible to provide the storage device capable of maintaining characteristics of the memory cells and reducing the leak current.

[Manufacturing Process of Selector Layer 306]

FIGS. 18 to 21 are schematic cross-sectional views illustrating a manufacturing process of the selector layer 306.

Figure 18:
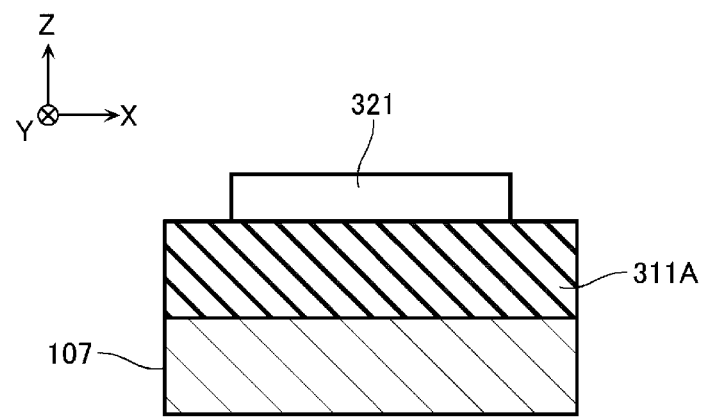
FIGS. 18-22 are schematic cross-sectional views illustrating a manufacturing process of a selector layer of the storage device according to the third embodiment.

When manufacturing the selector layer 306, an insulating layer 311A is formed on the upper surface of the electrode 107 as illustrated in FIG. 18. This process is performed similarly to, for example, the process described with reference to FIG. 7.

Next, a mask 321 is formed on an upper surface of the insulating layer 311A. In addition, part of the mask 321 is removed by the method such as the photolithography or the etching. The mask 321 remains at a position corresponding to a position of the insulating layer 311 (FIG. 17) in a view from the Z direction.

Figure 19:
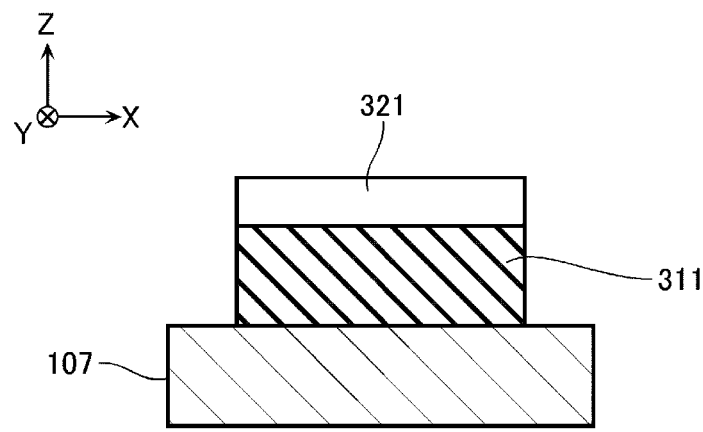

Next, as illustrated in FIG. 19, part of the insulating layer 311A is removed to form the insulating layer 311. This process is performed by, for example, the anisotropic etching such as the RIE.

Figure 20:
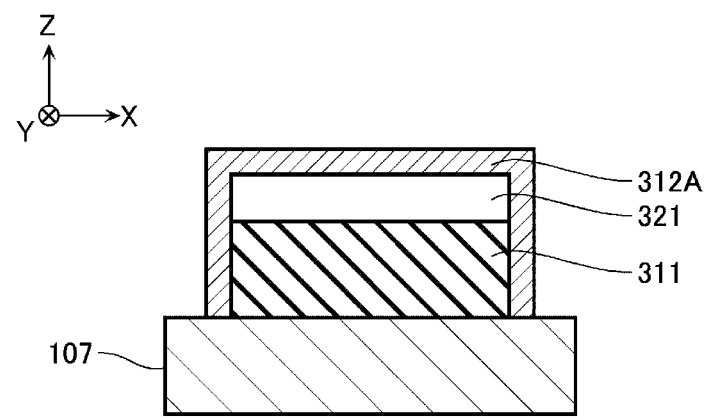

Next, as illustrated in FIG. 20, a selector member 312A is formed on outer peripheries of the insulating layer 311 and the mask 321 and an upper surface of the mask 321. This process is performed by a method, e.g., CVD or ALD (Atomic Layer Deposition). In this process, the selector member 312A is often simultaneously formed on the upper surface of the electrode 107. In such a case, the selector member 312A on the upper surface of the electrode 107 may be removed by the RIE or the like.

Figure 21:
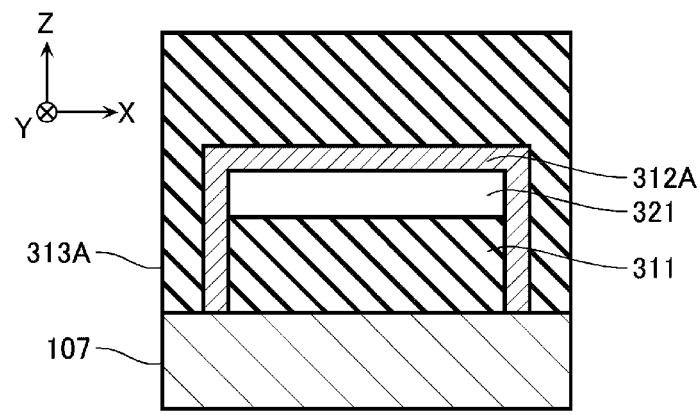

Next, as illustrated in FIG. 21, an insulating layer 313A is formed on upper surfaces of the electrode 107 and the selector members 312A. This process is performed by a method, e.g., CVD or ALD (Atomic Layer Deposition).

Figure 22:
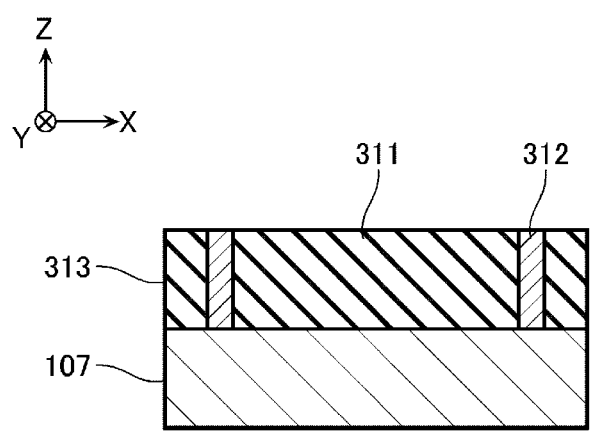

Next, as illustrated in FIG. 22, part of the insulating layer 313A and the selector member 312A and the mask 321 are removed to make uniform height positions of the upper surfaces of the insulating layer 311, the selector member 312A and the insulating layer 313A. This process is performed by, for example, the planarization processing such as the CMP or the etching processing such as the RIE. Part of the selector member 312A remaining in this process becomes the selector member 312. In addition, part of the insulating layer 313A remaining in this process becomes the insulating layer 313.

[Miscellaneous]

The storage devices according to the first to third embodiments have been described. However, the configurations described above are only examples and specific configurations and the like can be adjusted as appropriate. For example, in the first to third embodiments, the selector element SEL is not necessarily the filament-type.

[Miscellaneous]

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising a memory cell comprising:
   a variable resistance element; and
   a switching element having snapback current-voltage characteristics, wherein
   the switching element includes:
      a first conductive layer in contact with the variable resistance element;
      a second conductive layer; and
      a switching layer provided between the first conductive layer and the second conductive layer, the switching layer including at least one switching member and a first insulating layer having a thermal conductivity higher than 1.4 W/m/K, and
   a cross-sectional area or a sum of cross-sectional areas of the at least one switching member at a connection surface between the switching layer and the first conductive layer and a cross-sectional area or a sum of cross-sectional areas of the at least one switching member at a connection surface between the switching layer and the second conductive layer are each smaller than a cross-sectional area at a connection surface between the first conductive layer and the variable resistance element.

2. The storage device according to claim 1, wherein the first insulating layer contains beryllium oxide (BeO), aluminum nitride (AlN), magnesium oxide (MgO), silicon nitride (Si3N4), or diamond-like carbon.

3. The storage device according to claim 1, wherein the switching element is a filament-type switching element.

4. The storage device according to claim 1, wherein each of the at least one switching member contains a metal oxide.

5. The storage device according to claim 1, wherein each of the at least one switching member contains MO2-x, where M is cerium (Ce) or zinc (Zr), or contains AxM2O4, where A is lithium (Li), sodium (Na), potassium (K), or lanthanum (La), and M is nickel (Ni), cobalt (Co), or manganese (Mn).

6. The storage device according to claim 1, wherein the switching layer includes one switching member, and the first insulating layer contacts an outer periphery of the one switching member.

7. The storage device according to claim 1, wherein the switching layer includes a plurality of switching members, and the first insulating layer contacts an outer periphery of each of the plurality of switching members.

8. The storage device according to claim 1, wherein the switching layer includes one switching member and a second insulating layer that contacts an outer periphery of the one switching member, and the one switching member contacts an outer periphery of the first insulating layer.

9. The storage device according to claim 1, wherein the switching element and the variable resistance element are connected in series, and the storage device further comprises:
a first interconnection that extends in a first direction and that is connected to one end of the memory cell; and
a second interconnection that extends in a second direction crossing the first direction and that is connected to the other end of the memory cell.

10. The storage device according to claim 1, wherein the variable resistance element is a magnetoresistance effect element, and includes:
a first magnetic layer having a variable magnetization direction;
a second magnetic layer having a fixed magnetization direction; and
a non-magnetic layer provided between the first magnetic layer and the second magnetic layer.

11. A storage device comprising a memory cell comprising:
a variable resistance element; and
a switching element having snapback current-voltage characteristics, wherein
the switching element includes:
a first conductive layer in contact with the variable resistance element;
a second conductive layer; and
a switching layer provided between the first conductive layer and the second conductive layer, the switching layer including at least one switching member and a first insulating layer made of at least one of beryllium oxide (BeO), aluminum nitride (AlN), magnesium oxide (MgO), silicon nitride (Si3N4), and diamond-like carbon, and
a cross-sectional area or a sum of cross-sectional areas of the at least one switching member at a connection surface between the switching layer and the first conductive layer and a cross-sectional area or a sum of cross-sectional areas of the at least one switching member at a connection surface between the switching layer and the second conductive layer are each smaller than a cross-sectional area at a connection surface between the first conductive layer and the variable resistance element.

12. The storage device according to claim 11, wherein the switching element is a filament-type switching element.

13. The storage device according to claim 11, wherein each of the at least one switching member contains MO2-x, where M is cerium (Ce) or zinc (Zr), or contains AxM2O4, where A is lithium (Li), sodium (Na), potassium (K), or lanthanum (La), and M is nickel (Ni), cobalt (Co), or manganese (Mn).

14. The storage device according to claim 11, wherein the switching element and the variable resistance element are connected in series, and the storage device further comprises:
a first interconnection that extends in a first direction and that is connected to one end of the memory cell; and
a second interconnection that extends in a second direction crossing the first direction and that is connected to the other end of the memory cell.

15. The storage device according to claim 11, wherein the variable resistance element is a magnetoresistance effect element, and includes:
a first magnetic layer having a variable magnetization direction;
a second magnetic layer having a fixed magnetization direction; and
a non-magnetic layer provided between the first magnetic layer and the second magnetic layer.

* * * * *